United States Patent [19]
Prazak et al.

[11] 4,272,760
[45] Jun. 9, 1981

[54] SELF-CALIBRATING DIGITAL TO ANALOG CONVERSION SYSTEM AND METHOD

[75] Inventors: Paul R. Prazak; Theodore L. Williams, both of Tucson, Ariz.

[73] Assignee: Burr-Brown Research Corporation, Tucson, Ariz.

[21] Appl. No.: 28,667

[22] Filed: Apr. 10, 1979

[51] Int. Cl.³ .......................................... H03K 13/02
[52] U.S. Cl. ...................... 340/347 CC; 340/347 DA; 340/347 M
[58] Field of Search ..... 340/347 M, 347 DA, 347 CC

[56] References Cited

U.S. PATENT DOCUMENTS

| | | | |
|---|---|---|---|
| 3,530,458 | 9/1970 | Willard et al. | 340/347 CC |
| 3,790,910 | 2/1974 | McCormack | 364/573 X |
| 4,070,665 | 1/1978 | Glennon et al. | 364/852 X |

OTHER PUBLICATIONS

Barnes, First Monolithic 12-Bit DAC Uses A New Zener Trim Technique, Electronic Design 4, Feb. 15, 1977, (2 sheets).

Primary Examiner—Thomas J. Sloyan
Attorney, Agent, or Firm—Cahill, Sutton & Thomas

[57] ABSTRACT

A digital to analog conversion system includes a memory for storing a plurality of correction codes corresponding to corrections required to compensate for inaccuracy in output currents of a main digital to analog converter (DAC) contained in the digital to analog conversion system. A plurality of the logic inputs applied to the inputs of the main DAC are also applied to the address inputs of the memory. A trim DAC having its inputs coupled to the data outputs of the memory converts the correction code stored in the addressed location of the memory into a correction current which is utilized externally of the main DAC to modify the net amount of output current available from the main DAC to compensate for inaccuracy of the unmodified output current. An output signal from a temperature sensor is connected to a digital number which is also applied to a plurality of the address inputs. Correction codes stored in locations addressable in response to the temperature sensor have values which effect adjustment of the correction current to compensate for inaccuracy of the output current due to temperature variations. A self-calibration system and method which updates the correction codes stored in the memory are also disclosed.

16 Claims, 10 Drawing Figures

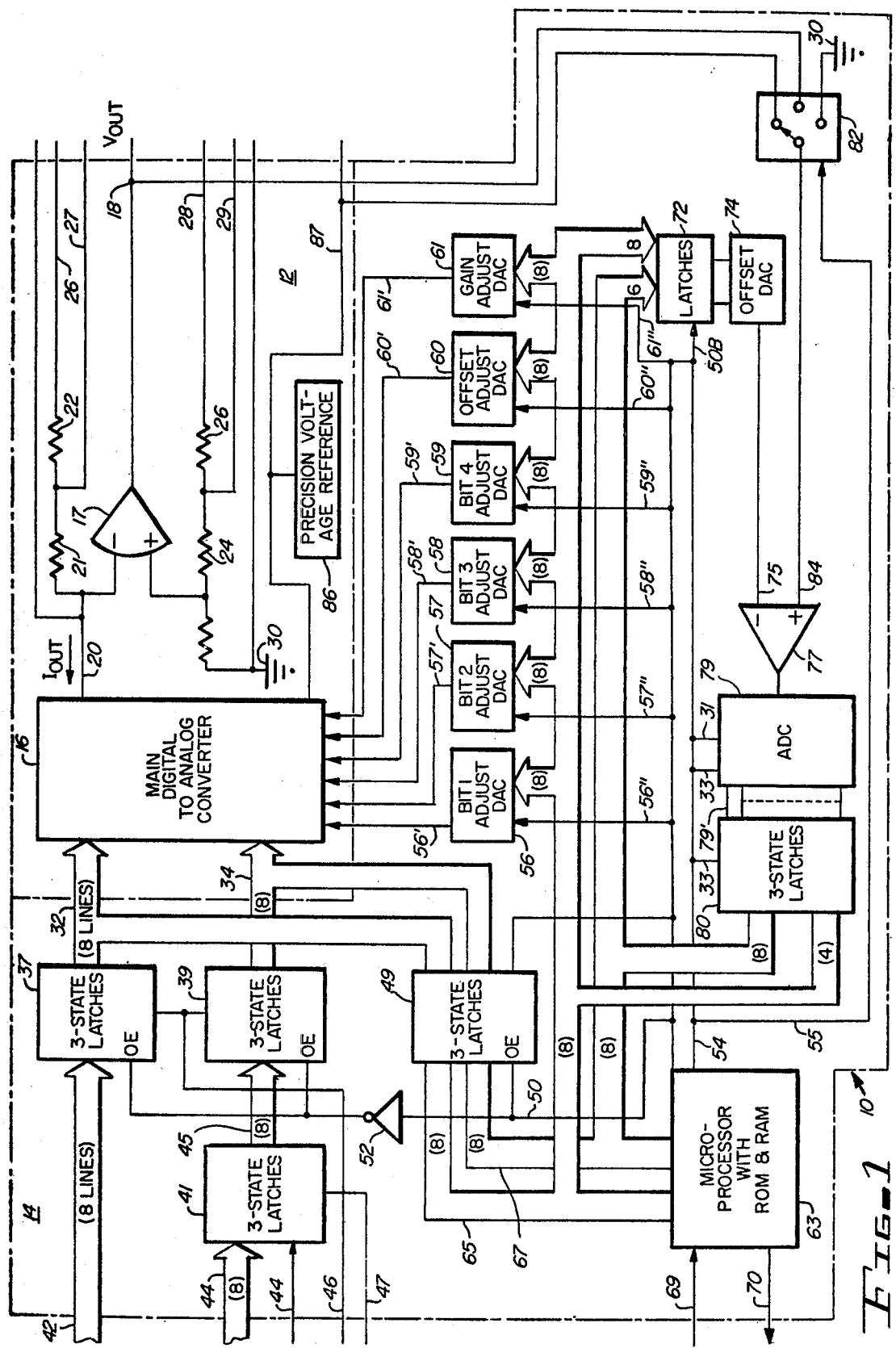

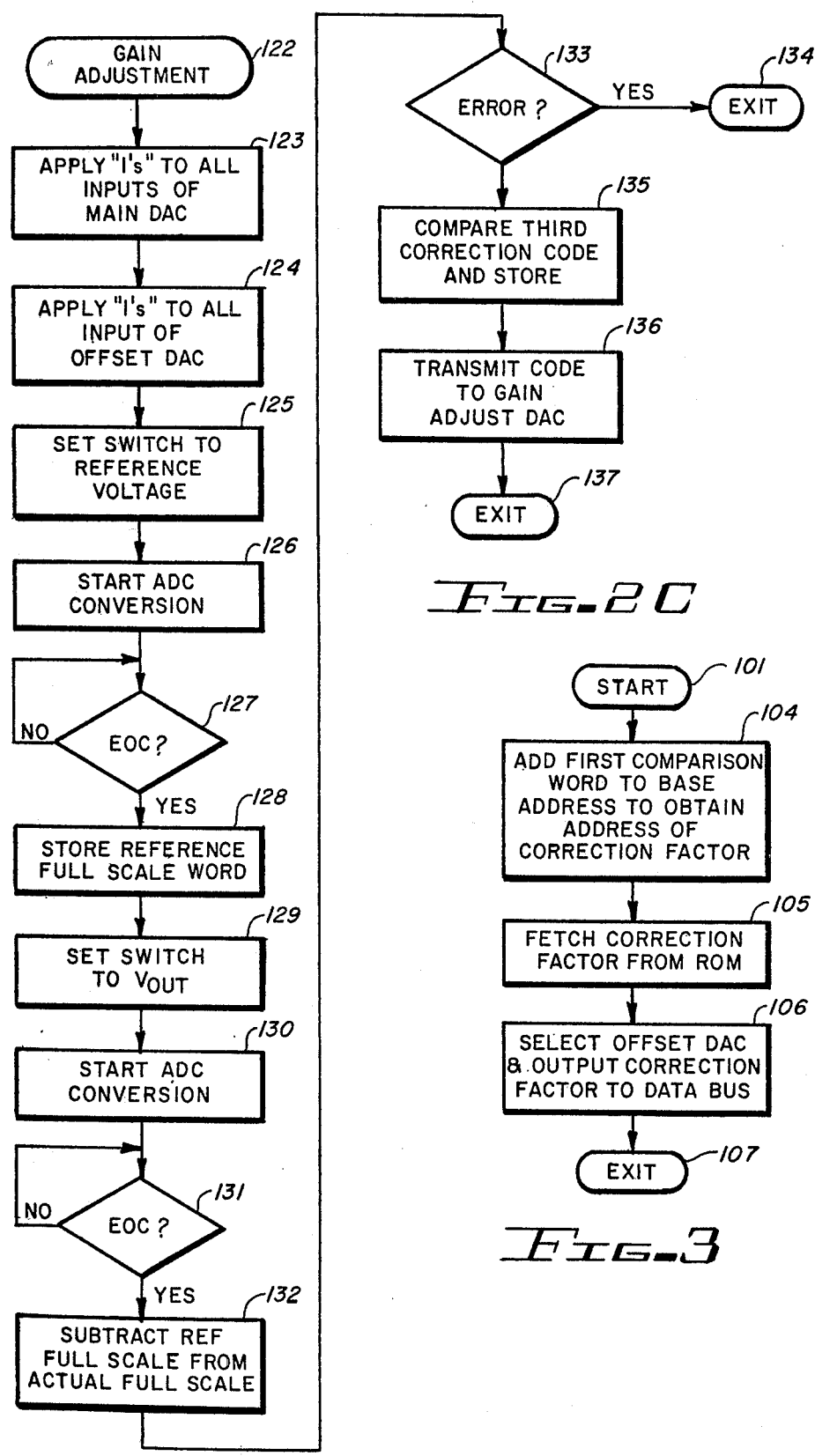

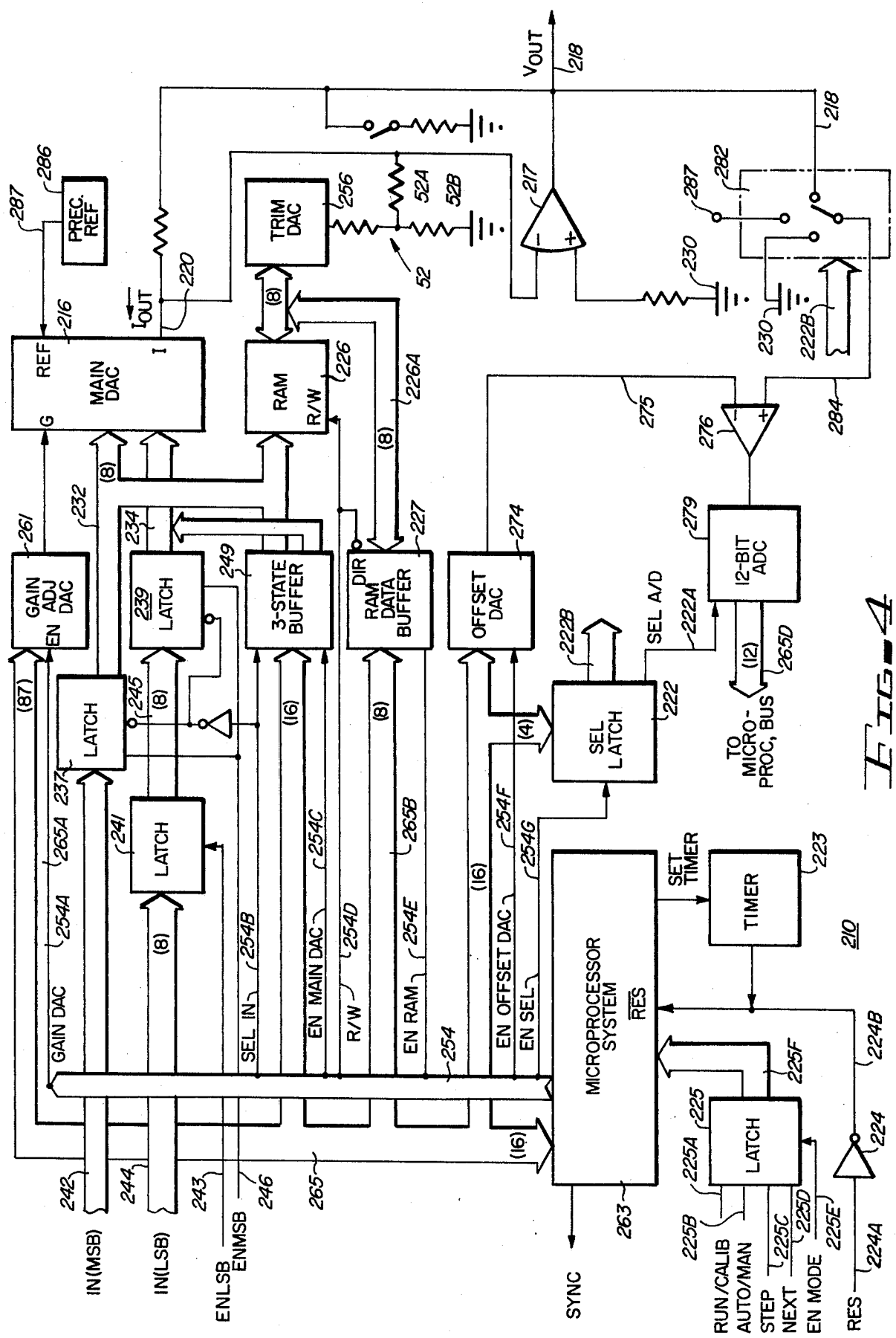

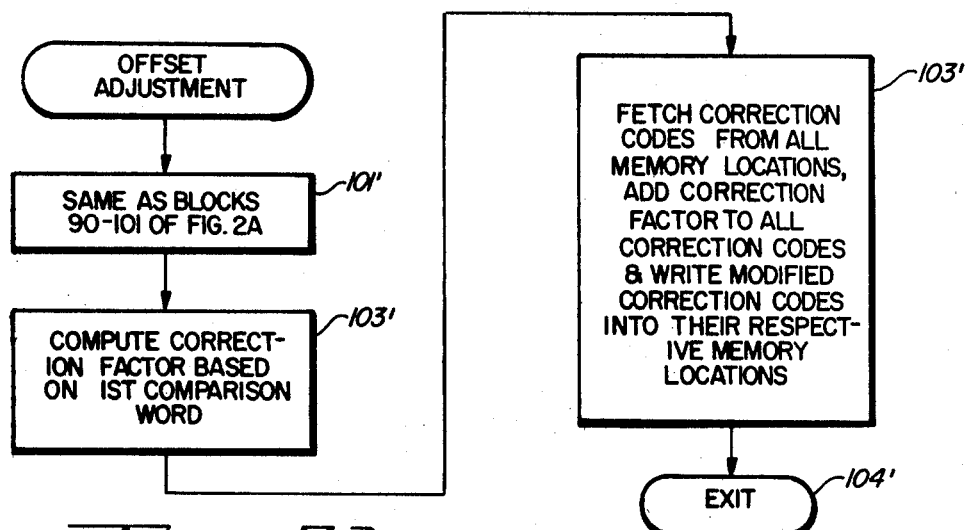
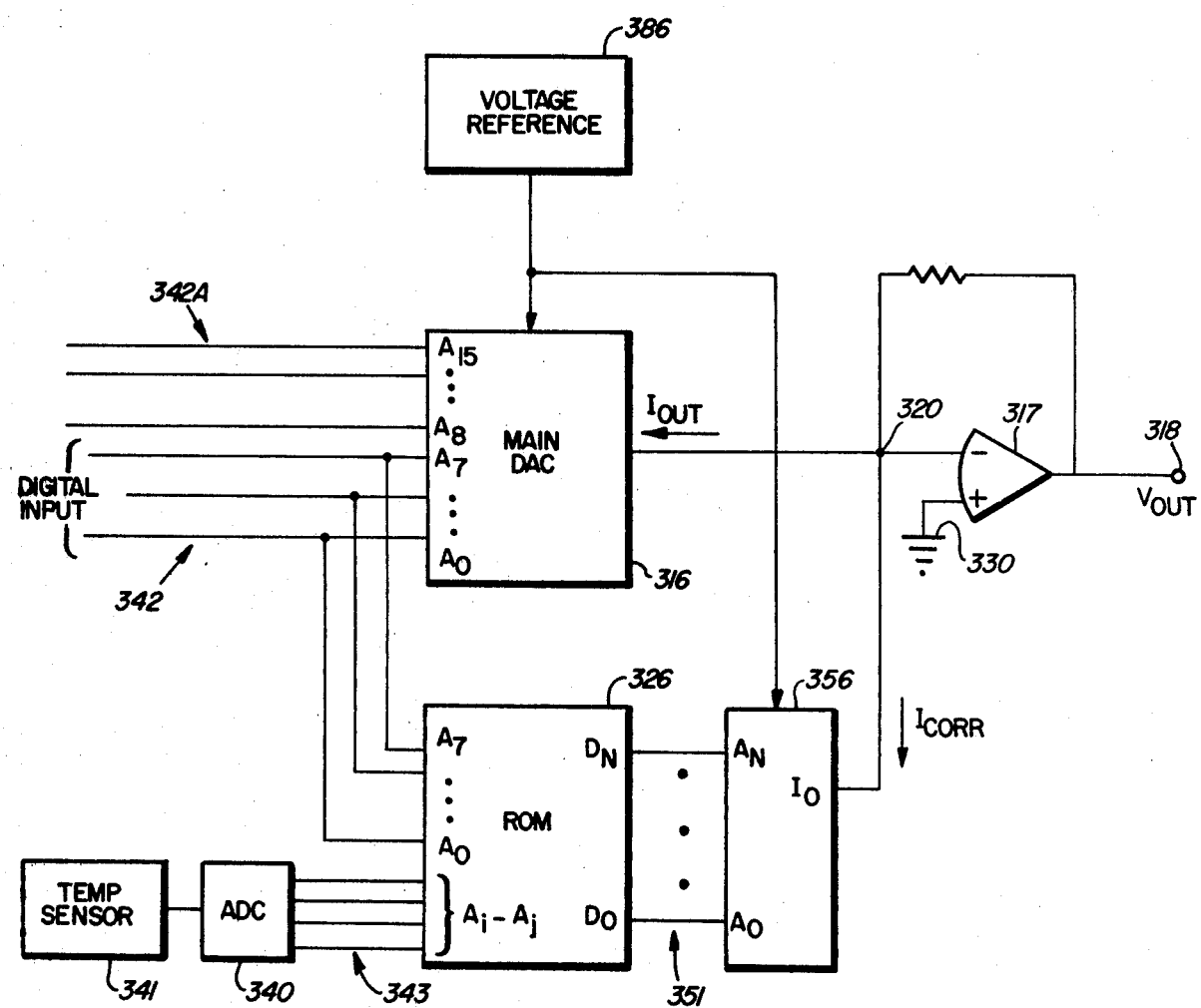

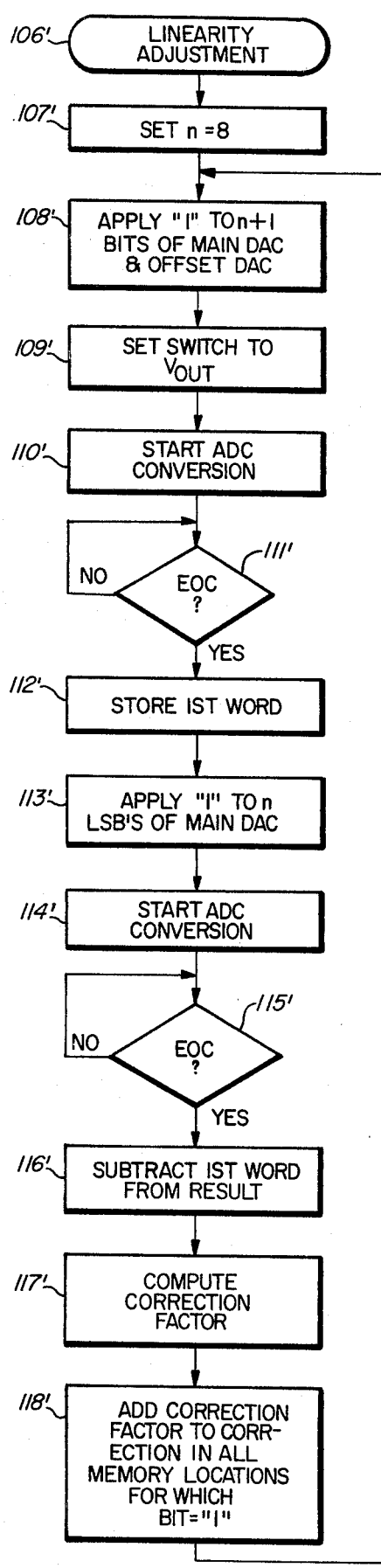
FIG.-5B
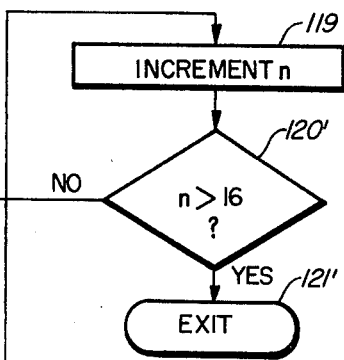
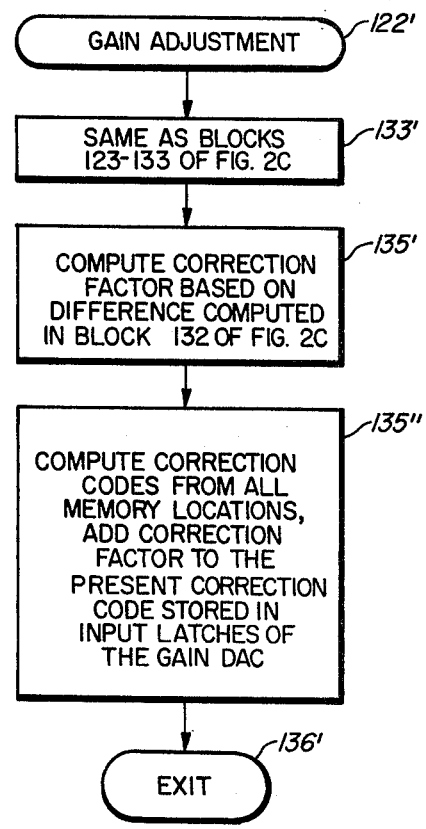
FIG.-5C

SELF-CALIBRATING DIGITAL TO ANALOG CONVERSION SYSTEM AND METHOD

BACKGROUND OF THE INVENTION

1. Field of the Invention

The invention relates to digital to analog converters, particularly to processor controlled systems for automatically calibrating digital to analog converters.

2. Description of the Prior Art

Digital to analog converters (DAC's) are widely utilized in the electronics industry to convert digital words into analog output signals representing the value of the digital word. At the present state of the art, it is quite feasible to manufacture accurate twelve bit or ten bit DAC's utilizing monolithic integrated circuit technology and/or hybrid integrated circuit technology. However, more accurate DAC's, (e.g., having thirteen bit accuracy or more) for example, sixteen bit DAC's, are much more expensive to manufacture. Careful internal thermal design of hybrid integrated circuit sixteen bit DAC's is necessary to minimize "superposition errors". Superposition errors arise from a number of causes, including thermal variations produced by quiescent power levels changing for different operating conditions in the integrated circuit structure and non-zero temperature coefficients or tracking of temperature coefficients of various components in the integrated circuit structure. Limitations on accuracy of present state of the art sixteen bit DAC's arise from errors in gain, offset voltages, and non-linearities in the four to six most significant bits. Presently, available sixteen bit DAC's include a large number of adjustment or "trimming" potentiometers which can be adjusted to calibrate the four most significant bits to compensate for errors in offset, linearity, and gain. A well known technique for performing such calibration involves electrically isolating a sixteen bit DAC from an electronic system in which it operates, and manually adjusting appropriate ones of the above mentioned potentiometers to adjust the output voltage of the DAC to produce zero voltage, as measured by a six and one-half digit digital volt meter when all the digital inputs to the DAC are logical "zeros". Then each of the four most significant bits is adjusted by manually adjusting others of the potentiometers to produce an output voltage difference corresponding to "one least significant bit" voltage differences between each of the four most significant bits and the respective sums of all less significant bits. Finally, the gain of the DAC is adjusted by applying all "ones" to the digital inputs of the DAC and adjusting a gain potentiometer to produce a predetermined full scale output voltage. The foregoing manual adjustment procedure has several serious shortcomings. First, the electronic system in which the DAC operates must be electrically disconnected or isolated from the DAC. This, of course, involves "down time" for the electronics system.

Accordingly, it is an object of the invention to provide a digital to analog converter which can be calibrated with minimum interruption of an electronics system in which the digital to analog converter is operatively connected.

A large number of adjustment potentiometers must be adjusted to accomplish accurate calibration of presently available high accuracy sixteen bit digital to analog converters. Further, expensive calibration equipment is required, such as a six and one-half digit digital volt meter costing approximately $4000. The average time for a skilled technician to calibrate present sixteen bit DAC's ranges from at least 10 minutes to well over half an hour.

It is another object of the invention to provide a method and apparatus for calibrating a digital to analog converter connected in an electronic system, which method and apparatus require a minimum number of manual adjustments and which require utilization of a minimum amount of low cost external equipment to accomplish the calibration procedure.

Presently available sixteen bit DAC's are very expensive, due to the high cost in fabricating devices with the proper thermal design, precision matching of integrated circuit components, and manufacture of high accuracy, low temperature coefficient bulk metal film resistors utilized in precision ladder resistor networks required for the four most significant bits. The cost of the numerous trim potentiometers is also quite high, as they may range in cost from $1 to more than $3 or $4.

It is therefore another object of the invention to provide a low cost digital to analog converter having a resolution of at least sixteen bits and having correspondingly high accuracy.

It is another object of the invention to provide an automatic digital to analog converter calibration system.

Another shortcoming of even the best of the presently available digital to analog converters having greater than approximately twelve bit accuracy is the act that accuracy is lost due to "drift" of component characteristics with both time and temperature. At the present state of the art, a sixteen bit high accuracy DAC must be recalibrated at least every three months, providing that the temperature range to which the DAC is subjected varies only by less than 10° C. Any time that the temperature varies by more than 10° C., accuracy is lost and the DAC must be immediately recalibrated.

It is yet another object of the invention to provide a high accuracy digital to analog converter device which can operate continuously with high accuracy over a wide temperature range.

There are many applications for DAC's wherein it is highly necessary that the output voltage of the DAC be monotonic, that is, the output always increases as the value of the digital input word applied to the digital inputs of the DAC increases, and wherein the output always decreases as the value of the digital input word decreases. This condition is present if the DAC has appropriately small non-linearity errors and superposition errors. However, the gain accuracy of a DAC frequently is less important than the linearity accuracy or monotonicity thereof, due to the fact that DAC's are commonly utilized in applications wherein comparison of a test signal with a control signal is made; under such conditions, linearity or relative accuracy is of primary importance. Thus, in such applications, it is highly desirable that the linearity of the DAC can be quickly and conveniently calibrated and recalibrated without making any external adjustments, without using any external reference voltage source, and without electrically isolating the DAC from the system in which it normally operates. Those skilled in the art will appreciate that if a digital to analog converter appears in a digital loop (for example, in a numerically controlled machine tool), non-monotonicity of the DAC could cause a control processor to produce an erroneous result or enter into a diagnostic routine or an "infinite loop".

It is therefore an object of the invention to provide a digital to analog converter of low cost wherein monotonicity or linearity can be automatically established by recalibration without use of any external reference.

SUMMARY OF THE INVENTION

Briefly described, and in accordance with one embodiment thereof, the invention provides a method and system for automatically compensating an output current of a digital to analog converter for each combination of digital inputs applied to the digital to analog converter. The invention also provides a method and system for automatically calibrating the automatic compensation system without requiring that the digital to analog converter be physically disconnected from an electronic system incorporating the digital to analog converter.

The described calibration system includes a set of three-state latches having inputs coupled to conductors of the electronic system for receiving an input word for conversion to an analog output signal. A processor system controls the latches to apply the input word to the digital inputs of a sixteen bit main digital to analog converter (DAC) during normal operation of the electronic system. The main DAC includes a "gain adjustment" input for adjusting the gain, respectively, of the main DAC. A memory for storing a plurality of correction codes corresponding to corrections required to compensate for inaccuracy of the output currents of the main DAC has a plurality of address inputs coupled to a plurality of the digital inputs of the main DAC. A trim DAC having its inputs coupled to the data outputs of the memory converts the correction code in an addressed location of the memory into a correction current which is used to alter the net amount of current available from the main DAC. Thus, every digital word applied to the inputs corresponding, for example, to the eight most significant bits of the main DAC therefore also addresses and accesses the memory, causing a correction code stored in the addressed memory location to be fetched and applied to the digital inputs of the trim DAC, which in turn produces the correction current needed to compensate for inaccuracy of the main DAC. The calibration system includes a precision voltage reference which is used to calibrate the full scale reading of the output signal of the main DAC. The main DAC has sixteen bits, the lowest eight of which are acceptably accurate without calibration. The calibration system includes a fourteen bit "offset" DAC and an analog switch of the single pole, triple throw type having outputs respectively coupled to the two inputs of a difference amplifier. The difference amplifier output is connected to the input of an analog to digital converter (ADC) which converts the amplified difference between the output voltages of the "offset" DAC and the analog switch to a digital word, which can then be inputted to the microprocessor.

During the calibration process, the microprocessor electrically isolates the inputs of the main DAC from the outputs of the input latches and applies "zeros" to all of the inputs of the main DAC and also to the inputs of the "offset" DAC. The microprocessor also controls the analog switch to electrically connect its output to a ground or reference potential. The difference between the output of the "offset" DAC and the ground potential is converted to a first digital word which is received and stored by the microprocessor. The microprocessor causes the analog switch to couple the output voltage of the main DAC to one input of the difference amplifier. The analog to digital (ADC) converter produces a second digital word which is compared with the first digital word. The microprocessor then computes a first correction number. The microprocessor then fetches the correction code presently stored in the addressed memory location, adds the first correction number to the fetched correction code, and writes the modified correction code into the same addressed memory location, and then in a similar manner adds the first correction number to all presently stored correction codes in the memory.

The microprocessor then performs a sequence of differential linearity tests on the system by setting a logic variable n equal to the number of the least significant bit for which accuracy compensation is desired. The microprocessor then causes "1's" to be written in the $n-1$ (i.e., the next more significant bit than the nth bit) bits of the main DAC and the offset DAC, respectively. The output voltage produced by the main DAC (produced by a current to voltage converter connected to the current output terminal of the main DAC) is compared to the output voltage produced by the main DAC when "1's" are applied to the n least significant bits of the main DAC. Any resulting variation from a one least significant bit difference between the two voltages is utilized to compute a correction number which is added to the present correction codes stored in all of the memory locations for which the n bit is equal to "1". The value of n is decremented and the foregoing procedure is repeated until n equals zero. Finally, the microprocessor applies "ones" to all of the inputs of the main DAC, and the "offset" DAC, and controls the analog switch, causing the precision voltage reference and the output of the main DAC to be sequentially applied to one input of the difference amplifier, and causing fourth and fifth digital words corresponding to the value of the precision voltage reference and the output voltage of the main DAC, respectively, to be compared. A resulting correction number then is added to the correction code presently stored in the input latches of the gain adjustment DAC, which produces an analog correction signal causing the output voltage to be adjusted toward the voltage of the precision voltage reference.

DESCRIPTION OF THE DRAWINGS

FIG. 1 is a detailed block diagram of a self-calibrating DAC system.

FIGS. 2A–2C constitute a flow chart useable in explaining the operation of the system of FIG. 1.

FIG. 3 constitutes a flow chart useful in describing the computation of correction codes made by the microprocessor of FIG. 1.

FIG. 4 is a detailed block diagram of one embodiment of the invention.

FIGS. 5A–5C constitute a flow chart which is useful in explaining the operation of the system of FIG. 4.

FIG. 6 is a block diagram of a DAC system according to the invention.

DESCRIPTION OF THE INVENTION

Figures 2A, 2B:
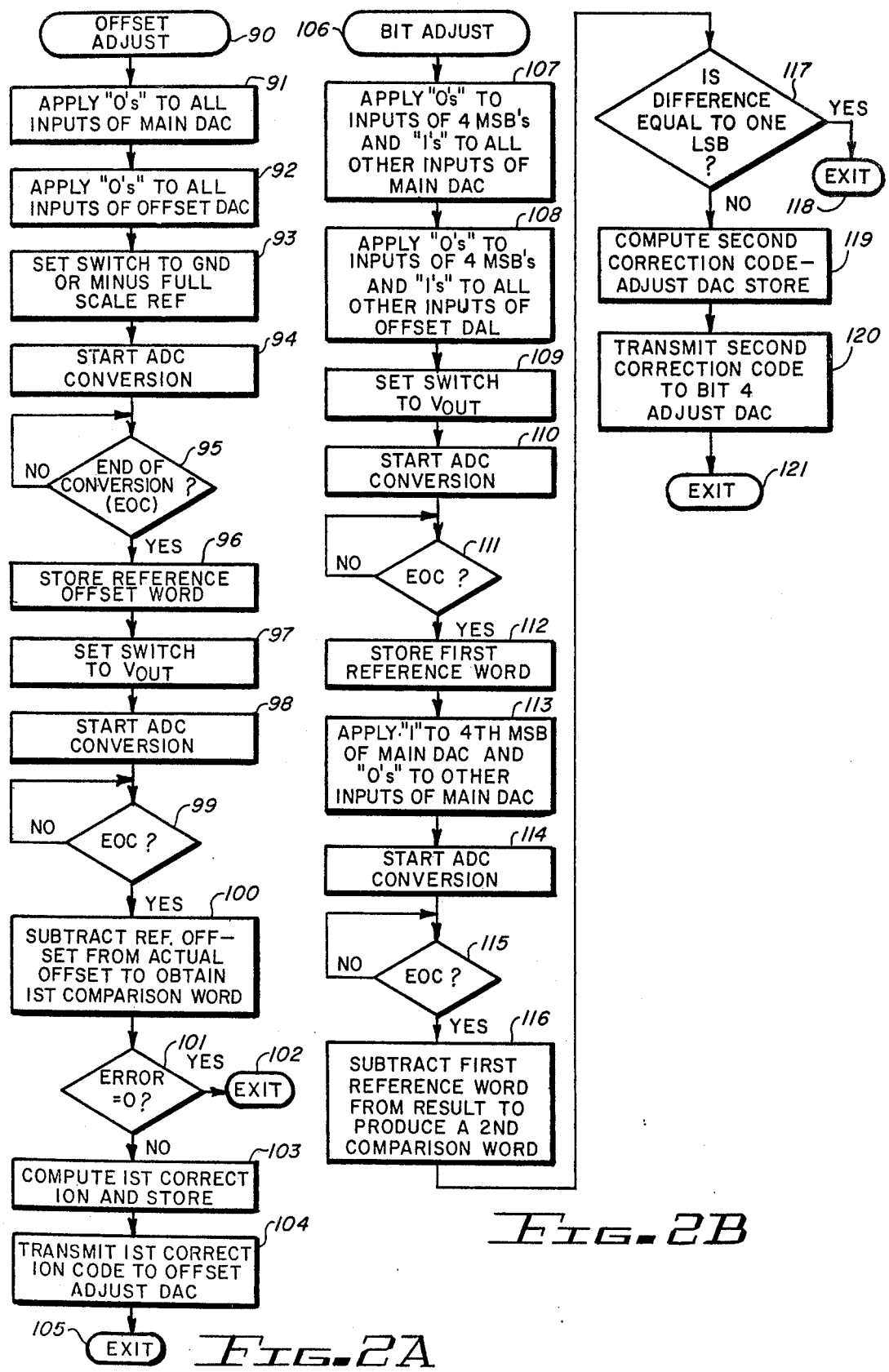

Co-pending application entitled "METHOD AND APPARATUS FOR CALIBRATING A DIGITAL TO ANALOG CONVERTER", Ser. No. 005,357, filed on Jan. 22, 1979 now U.S. Pat. No. 4,222,107, issued Sept. 9, 1980 and assigned to the present assignee is incorporated herein by reference.

The method and apparatus of the present invention can be best understood by first referring to the structure of system 10 in FIG. 1, which includes a digital to analog converter (DAC) subsystem 12. DAC subsystem 12 includes a main DAC 16 having an output terminal 20 and sixteen digital inputs connected to the respective conductors of eight bit buses 32 and 34. DAC subsystem 12 includes output circuitry including an operational amplifier 17 having a negative input connected to terminal 20 and a positive input coupled to ground conductor 30 by means of a resistor. Operational amplifier 17 has an output terminal 18, whereat output voltage $V_{OUT}$ (which represents the numerical value of a digital word applied to buses 32, 34) is produced. A resistor feedback network including resistors 21 and 22 provides two alternate feedback paths from output terminal 18 for controlling the magnitude of the voltage range of $V_{OUT}$. Resistors 24 and 26 can be utilized to compensate for differences in ground reference voltages between ground conductor 30 and ground conductors of a system (not shown) to which system 10 is connected.

DAC subsystem 12 includes a precision voltage reference 86 connected to main DAC 16 for controlling the magnitude of DAC output current $I_{OUT}$ flowing into terminal 20. Six "adjustment inputs" indicated by reference numerals 56', 57', 58', 59', 60' and 61' are utilized to trim or adjust the components of $I_{OUT}$ controlled by the four most significant bits of main DAC 16, to adjust the offset, and to adjust the gain, respectively, of main DAC 16.

Bus 32 includes eight conductors which are connected to eight inputs of main DAC 16, which conductors are connected to the respective outputs of eight three-state latches 37. Similarly, bus 34 includes eight conductors connected to eight additional inputs of DAC 16 and also connected to the respective outputs of eight three-state latches 39. The inputs of the eight latches represented by reference numeral 37 are connected, respectively, to eight conductors of bus 42, which is connected to an electronic system (not shown) in which system 10 is operatively connected. Similarly, the inputs of the eight latches represented by reference numeral 39 are connected, respectively, to the outputs of eight three-state latches 41 having their respective inputs connected to the eight conductors of bus 44, which is also connected to the electronic system (not shown). (The eight conductors of bus 42 also can be connected to inputs of three-state latches 41 so that inputs 44 can be omitted, if it is desired to connect system 10 to an "eight bit" electronic system rather than a "sixteen bit" electronic system.) Conductor 47 is connected to the enable inputs of three-state latches 41 in order to enable the eight least significant bits (LSBs) of a digital input word to be outputted from three-state latches 41 onto conductors 45 to the inputs of three-state latches 39. Similarly, conductor 46 is connected to enable inputs of latches 37 and 39 to apply the information stored in latches 37 and 39 to buses 32 and 34, respectively.

System 10 includes a calibration subsystem 14 which includes three-state input latches or digital input means 37, 39, and 41 and also includes four "bit adjustment" DAC's or adjusting means 56, 57, 58 and 59 connected to respective ones of the above mentioned "adjustment inputs" 56', 57', 58', and 59' of main DAC 16. Calibration subsystem 14 also includes an "offset adjustment" DAC 60 connected to "offset adjust" input 60' of main DAC 16 and a "gain adjustment" DAC 61 connected to "gain adjustment" input 61' of main DAC 16. "Bit adjustment" DAC's 56, 57, 58 and 59, "offset adjustment" DAC 60 and "gain adjustment" DAC 61 all include input latches (not shown) which are capable of storing correction codes conducted by bus 65. Such correction codes are entered into the subject input latches when the respective DAC's are enabled by enable conductors 56", 57", 58", 59", 60" and 61". Calibration subsystem 14 further includes a latch circuit 72, which includes 14 latches having their respective outputs connected to corresponding inputs of "offset" DAC 74 or first conversion means 74. The output of "offset" DAC 74 is connected to a negative input of difference amplifier or comparison means 77, which has a positive input connected to conductor 84. Difference amplifier 77 is actually of a type known as an instrumentation amplifier in the present embodiment of the invention. Conductor 84 is connected to the output of a single pole, triple throw analog switch 82 having three switchable inputs connected to conductors 87, 18 and 30 so that any one of the precision reference voltage, $V_{OUT}$, or ground voltage can be applied to the positive input of difference amplifier 77.

The output difference amplifier 77 is connected to an analog to digital converter (ADC) or second conversion means. ADC 79 is a twelve bit ADC having its twelve digital outputs 79' connected to the inputs of twelve three-state latches collectively represented by reference numeral 80.

The above described three-state latches, "bit adjustment" DAC's, "offset adjustment" DAC, "gain adjustment" DAC, latches 72, and analog switch are all controlled by microprocessor system 63. (It should be noted that any suitable type of processor oriented or computer oriented system could be used; microprocessors are readily available and are used in the described embodiment of the invention). Microprocessor system 63 includes a microprocessor or computing means, a read only memory used for storing a control program, and a random access memory or storing means. Microprocessor system 63 has a plurality of control inputs, such as "Interrupt" and "Reset" inputs, collectively represented by reference numeral 69, and a status output 70. Microprocessor system 63 has a plurality of Input/Output (I/O) terminals connected to the respective conductors of buses 65 and 67. The respective conductors of buses 65 and 67 are connected to the inputs of sixteen three-state latches collectively designated by reference numeral 49. The conductors of bus 67 are also connected to the respective outputs of eight three-state latches in block 80. Four of the conductors of bus 65 are connected to the respective outputs of four remaining latches in block 80. The conductors of bus 67 are also connected to the eight digital inputs of each of the "bit adjustment" DAC's 56, 57, 58, and 59, "offset adjustment" DAC 60 and "gain adjustment" DAC 61, and to the respective inputs of eight latches contained in block 72. Six of the conductors of bus 67 are connected to the respective inputs of six additional latches in block 72.

Microprocessor system 63 provides a number of output control signals on a group of conductors collectively referred to as control bus 54. One of the conductors of control bus 54 designated by reference numeral 50 is connected to enable the latches in block 49 and also to an input of inverter 52. The output of inverter 52 is connected to enable the three-state latches in blocks 37 and 39. Thus, microprocessor system 63 can isolate buses 32 and 34 from latches 37 and 39 and then apply stored information (precisely written into the three-state latches in block 49 via conductors 65 and 67) to the digital inputs of main DAC 16 connected to the conductors of buses 32 and 34.

Another conductor of control bus 54 is connected to enable the three-state latches in block 49. Further, individual conductors of control bus 54 are respectively connected to the enable inputs 56″, 57″, 58″, 59″, 60″ and 61″ of adjustment DAC's 56, 57, 58, 59, 60, and 61. Another conductor of control bus 54 is applied to enable the latches in block 72. Another three conductors of control bus 54 collectively designated by reference numeral 55 are applied as selection inputs to analog switch circuitry 82 to electrically connect output conductor 84 to a selected one of input conductors 87, 18 and 30.

The components shown in FIG. 1 may be implemented utilizing devices which are commercially readily available. For example, the three-state latches in blocks 37, 39, 41 and 49 can be implemented utilizing series 74LS373 integrated circuits, which are manufactured by various semiconductor companies. Operational amplifier 17 can be implemented utilizing a precision operational amplifier Model OP-01H, manufactured by Precision Monolithics Corp. Precision voltage reference 86 can be implemented utilizing a temperature stabilized monolithic zener reference manufactured by National Semconductor Corporation and designated as Model LM199A. The "adjustment" DAC's 56, 57, 58, 59, 60, and 61 can be implemented utilizing inexpensive Signetics Model 5018 eight bit DAC's. Microprocessor system 63 can be implemented utilizing a Mostek 3870 microprocessor. Difference amplifier 77 can be implemented utilizing the Burr-Brown Model 3630 instrumentation amplifier. Analog to digital converter 79 can be implemented utilizing a Burr-Brown Model ADC80 analog to digital converter. "Offset" DAC 74 can be implemented utilizing a fourteen bit Burr-Brown DAC71 digital to analog converter. The latches in block 72 can be implemented utilizing Series 74LS273 integrated circuit latches. Analog switch 82 can be implemented utilizing a Siliconix DG-170 analog switch. A device identical to main DAC 16 is not yet available on the market, since presently available sixteen bit DAC's do have the "adjustment inputs" 56′, 57′, 58′, 59′, 60′, and 61′ only as internal nodes, but not provided as external inputs. However, various presently available sixteen bit DAC's, such as the MP8116 manufactured by Analogic Corporation, modified to provide "adjustment inputs" 56′, 57′, 58′, 59′, 60′, and 61′ as external inputs could be utilized to implement main DAC 16. The assignee of this application is presently developing a suitable sixteen bit DAC to be designated as the SM10173 D/A converter submodule.

The detailed calibration procedure implemented by system 10 is accomplished by first adjusting $V_{OUT}$ (FIG. 1) by an amount sufficient to compensate for the offset of main DAC 16. This is accomplished by adjusting current out of "offset adjustment" input 60′ of DAC 16 so that $V_{OUT}$ equals the ground reference voltage when all "zeros" are applied to the conductors of buses 32 and 34. Next, the four "bit adjustment" inputs 59′, 58′, 57′, and 56′ are sequentially adjusted in that order to linearize $V_{OUT}$ as a function of linear increases in the value of the number represented by the digital input word applied to the digital inputs of DAC 16. Finally, the gain of DAC 16 is calibrated by adjusting the "gain adjustment" input 61′ to adjust $V_{OUT}$ in relationship to the precision reference voltage produced by precision voltage reference source 86 when all "ones" are applied to the conductors of buses 32, 34 by microprocessor system 63.

Referring now to FIG. 2A, initially an operating algorithm stored in microprocessor 63 electrically isolates main DAC 16 from the conductors of buses 42 and 44 by producing a logical "one" on conductor 50, enabling the three-state latches in block 49, producing a "zero" on the output of inverter 52, thereby causing the three-state latches in blocks 37 and 39 to assume their high output impedance state. Thus, the conductors in buses 32 and 34 are electrically coupled to the outputs of the three-state latches in block 49 so that the contents thereof are applied to the respective conductors of buses 32 and 34. At this point, microprocessor 63 "enters" the "offset adjust" algorithm, as indicated by label 90 in FIG. 2A. The algorithm first causes microprocessor 63 to transmit a first pattern of logical "zeros" on all of the conductors of buses 65 and 67, thereby loading "zeros" into the latches in block 49, and causing logical "zeros" to be applied to all sixteen digital inputs of main DAC 16 via the conductors of buses 32 and 34, causing main DAC 16 to produce a first output voltage; this is indicated by block 91 in FIG. 2A. The algorithm causes logical "zeros" to be loaded into the latches of block 72 and causes an enable signal to be applied to conductor 50B of control bus 54, enabling the logical "zeros" to be applied to all fourteen inputs of "offset" DAC 74, as indicated in block 92, causing "offset" DAC 74 to produce a first offset signal.

Essentially simultaneously with the above steps, microprocessor system 63 produces an enable signal on one of conductors 55, causing ground reference voltage on conductor 30 to be directly connected to the positive input of difference amplifier 77, as indicated in block 93 of FIG. 2A. As indicated by block 94 and decision block 95 in FIG. 2A, main DAC 16 begins conversion of the sixteen logical "zeros" applied at its digital inputs in a well known manner to produce a corresponding output current $I_{OUT}$ flowing through output terminal 20; offset DAC 74 also begins conversion of the logical "zeros" applied to its inputs to produce the above mentioned first offset voltage on conductor 75. Meanwhile, microprocessor system 63 enters into a "wait" loop, continually testing for a status signal from ADC 79 indicating completion of the conversion. It should be noted that DAC's and ADC's normally have enable or "start conversion" inputs which enable the devices or cause them to begin their respective conversion operations. ADC 79 also has an "end conversion" status output to indicate when the conversion is complete. After the conversion by "offset" DAC 74 is completed, the difference between the ground reference voltage signal applied to conductor 84 via analog switch 82 and the offset output voltage on conductor 75 is multiplied by approximately 1000 by difference amplifier 77 to produce a first difference signal, which is then applied to the input of analog to digital converter (ADC) 79. Microprocessor system 63 causes a control signal to be applied to "start conversion" conductor 31, which causes analog to digital converter (ADC) 79 to begin its conversion process. When that conversion process is complete, an enable signal is produced on "end of conversion" conductor 33, causing a first digital word, which is the digital representation of the voltage at the output of amplifier 77, to be stored in twelve latches contained in block 80. The first digital word is transmitted via buses 65 and 67 to microprocessor system 63 and is stored in the random access memory thereof, as indicated by block 96 in FIG. 2A.

Next, microprocessor system 63 causes analog switch 82 to connect conductor 84 to conductor 18, so that $V_{OUT}$ (which is now equal to the first output voltage) is applied to the positive input of amplifier 77, thereby producing a second difference voltage signal which is applied to the input of analog to digital converter 79. Microprocessor system 63 waits in a test loop until analog to digital converter 79 completes its conversion of the amplified second difference voltage signal to produce a second digital word, as indicated by block 98 and decision block 99 of FIG. 2A.

Next, the algorithm causes the first stored digital word to be subtracted from the second digital word (which represents the actual offset voltage of DAC 16) to produce a first comparison word. This process corresponds to block 100 of FIG. 2A. The algorithm then enters decision block 101, wherein microprocessor system 63 tests the first comparison word (produced in accordance with block 100) to determine if the error is zero. If it is, the offset adjust algorithm is exited, as indicated by label 102. However, if the error is not equal to zero, the algorithm enters block 103, and computes a first correction word or code, in accordance with computation algorithm of FIG. 3. The first correction code is then stored by microprocessor system 63. Next, the algorithm transmits the first correction code to the digital inputs of "offset" DAC 60, as indicated in block 104, and exits the "offset adjustment" subroutine, as indicated by label 105. "Offset adjustment" DAC 60 then automatically converts the first correction code to a first analog correction signal which is applied to "offset adjustment" input 60' of main DAC 16, thereby causing $V_{OUT}$ to be adjusted to precisely equal the voltage on ground conductor 30. It should be noted that the above process can be repeated if desired to achieve increased accuracy, since the initial error of the second computation would be much smaller than for the above described first offset adjustment calibration procedure. This would be especially desirable if the initial difference between the positive and negative inputs of difference amplifier 77 were sufficiently large to cause operation outside the linear output range of difference amplifier 77.

Next, the algorithm enters the "bit adjustment" algorithm, as indicated by label 106 in FIG. 2B. The "bit adjustment" algorithm then causes a second pattern of logical signals to be applied to the inputs of main DAC 16. More specifically, the algorithm causes logical "zeros" to be applied to the inputs of the four most significant bits of main DAC 16 and applies logical "ones" to the remaining inputs of main DAC 16, as indicated in block 107. Main DAC 16 converts the second pattern to a second output signal. Microprocessor system 63 also causes "zeros" to be applied to the inputs of the four most significant bits of "offset" DAC 74 and logical "ones" to the other inputs of "offset" DAC 74, as indicated in block 108. "Offset" DAC 74 converts the second pattern to a second offset signal. Next, the algorithm causes microprocessor system 63 to cause analog switch 82 to connect $V_{OUT}$ (conductor 18) to conductor 84, thereby applying $V_{OUT}$ (which is equal to the second output voltage) to the positive input of difference amplifier 77, which produces a third difference signal. This step is shown in block 109 of FIG. 2B. As shown in block 110 and decision block 111 of FIG. 2B, main DAC 16, "offset" DAC 74 and analog to digital converter 79 all carry out their respective conversion processes until completed, as microprocessor system 63 operates in a test loop awaiting a signal indicating that the last of the subject conversion processes is complete. At this point, a third digital word corresponding to the difference between $V_{OUT}$ and the output voltage of "offset" DAC 74 is computed and stored in the random access memory of microprocessor system 63, as indicated in block 112 of FIG. 2B.

The algorithm then enters block 113, causing microprocessor system 63 to apply a fourth pattern of logical signals, including a logical "one" to the fourth most significant bit of main DAC 16 and logical "zeros" to the remaining inputs of main DAC 16.

As indicated in block 114 and decision block 115, microprocessor system 63 operates in a test loop awaiting the arrival of an indication that main DAC 16 and analog to digital converter 79 have completed their respective conversions. At this point, a fourth digital word produced by analog to digital converter 79 is stored in latches 80.

Next, the algorithm enters block 116, wherein the third reference word produced in block 112 is subtracted from the fourth digital word produced by the most recent conversion of analog to digital converter 79. This procedure produces a second comparison word which represents the change in $V_{OUT}$ correspnding to the difference in value of the two digital words most recently applied to the inputs of main DAC 16 in block 107 and 113. This difference should equal the theoretical change in $V_{OUT}$ corresponding to a "least significant bit change", such change in $V_{OUT}$ hereinafter being referred to as a "LSB voltage change", in the digital word applied to the digital inputs of main DAC 16. If the second comparison word is equal to the digital equivalent of one LSB voltage change, as indicated in decision block 117 of the algroithm, there is no error, and the algorithm exits as label 118. However, if the second comparison word is not equal to the digital equivalent of one LSB voltage change, the algorithm enters block 119, wherein microprocessor system 63 enters a computation algorithm similar to that shown in FIG. 3 and computes a second correction code and stores the second correction code in the random access memory of microprocessor system 63, as indicated in block 119 of FIG. 2B. The algorithm then transmits the second correction code to the digital inputs of "bit adjustment" DAC 59, and exits the bit adjust algorithm label 121. "Bit adjustment" DAC 59 then converts the second correction code to produce a second analog correction signal, which is applied to "bit adjustment" input 59' of main DAC 16, causing $V_{OUT}$ to be adjusted to precisely equal a voltage which is one LSB voltage change greater than the most recent previous value of $V_{OUT}$ produced by main DAC 16.

The procedure of the algorithm of FIG. 2B is in essence repeated for each of the remaining most significant bits of main DAC 16 in increasing significant bit order, except that the steps indicated in blocks 107 and 113 apply to the third most significant bit, then to the second most significant bit, etc. After the most significant bit of main DAC 16 has been calibrated in the manner of the algorithm of FIG. 2B, the linearization calibration procedure is complete. Microprocessor system 63 then jumps to the "gain adjustment" algorithm of FIG. 2C at label 122.

The "gain adjustment" algorithm 122 of FIG. 2C is essentially similar to the offset adjustment algorithm of FIG. 2A, except that in blocks 123 and 124 microprocessor system 63 applies all "ones" to the inputs of main DAC 16 and "offset" DAC 74. In block 125, analog switch 82 is caused to connect the reference voltage on conductor 87 to conductor 84. The reference word stored in block 128 corresponds to the full scale voltage $V_{OUT}$, rather than the ground reference voltage on conductor 30, as in block 96 of FIG. 2A. In block 129, analog switch 82 is connected to $V_{OUT}$, as in block 97. The steps in blocks 132, 133, 135 and 136 are entirely similar to the corresponding operations in blocks 100, 101, 103, and 104 of FIG. 2A. Thus, the "gain adjustment" algorithm of FIG. 2C causes the full scale value of $V_{OUT}$ to be precisely adjusted with respect to the precision reference voltage produced by circuit 86, which is the only component of FIG. 1 which ever requires manual adjustment.

The computation made in block 103 of FIG. 2A is shown in more detail in the flow chart of FIG. 3, which sets forth the steps involved in computing the first correction code. Referring now to FIG. 3, microprocessor 63 enters the "correction code algorithm" at label 101. After fetching the base address (the first address of a table of correction factors stored in the read only memory of microprocessor system 63) and adds the first comparison word to the base address, as indicated in block 104 of FIG. 3, to obtain the address of the required correction factor. Next, the algorithm causes microprocessor system 63 to address its read only memory (ROM) to fetch the first correction factor, as indicated in block 105. Microprocessor system 63 then generates an enable signal which causes "offset adjustment" DAC 60 to be enabled and outputs the fetched correction factor onto the conductors of bus 65. Offset adjustment DAC 60 then automatically generates the desired correction current into "offset adjustment" input 60' of main DAC 16.

A very similar algorithm to that of FIG. 3 controls the operation of processor system 63 to compute the second correction code referred to in block 119 of FIG. 2B during execution of the "bit adjustment" algorithm previously described. However, one of the adjustment DAC's is selected instead of the "offset adjustment" DAC, so that the computed correction code is received by that "bit adjustment" DAC. Computation of the third correction code, referred to in block 135 of FIG. 2C is also similar to the computation described above with reference to FIG. 3.

Another self-calibrating digital to analog converter system 210 is shown in FIG. 4. The digital to analog converter system 210 of FIG. 4 is similar or identical to the self-calibrating digital to analog converter system of FIG. 1 in many respects. Where applicable, the reference numerals used to designate components in FIG. 10 are preceded by the digit "2" to designate corresponding, similar, or identical components in FIG. 4. It should be noted that the major difference between self-calibrating digital to analog converter systems 10 of FIG. 1 and 210 of FIG. 4 is that the latter system does not utilize bit adjustment DAC's (56–59) or an offset adjustment DAC 60, as illustrated in FIG. 1. Instead, self-calibrating DAC 210 of FIG. 4 utilizes a trim DAC 256 which produces an adjustment current which is drawn out of mode 220 of main DAC 216 to compensate for inaccuracies in main DAC 216 due to aging, temperature variations, etc. Thus, the output current of main DAC 216 is adjusted externally (rather than internally, as in the system of FIG. 1) to main DAC 216 in the system shown in FIG. 4.

The basically different structural features of the system of FIG. 4 include trim DAC 256, random access memory (RAM) 226, and random access memory data buffer 227, and the connections between random access memory 226 and three-state buffer circuitry 219, control bus 254, trim DAC 256, and RAM data buffer 227. More specifically, three-state buffer circuitry 249 has eight of sixteen outputs connected not only to the digital inputs of main DAC 216, but also to the address inputs of random access memory 226. Microprocessor system 263 produces a read/write signal on conductor 254D, which is included among the conductors of control bus 254. Read/write conductor 254D is connected to the read/write control input of random access memory 256 and to a directional control input of random access memory buffer 227. The data outputs of random access memory 226 are connected by means of eight-conductor bus 226A to the digital inputs of trim DAC 256 and to corresponding terminals of bidirectional RAM data buffer 227. RAM data buffer 227 has another set of terminals connected to a group of conductors 265B of microprocessor data bus 265.

Trim DAC 256 has its analog output connected to a precision resistor network 52 which controls the proportion of the analog output current of trim DAC 256 utilized to modify the output current $I_{OUT}$ of main DAC 216.

Other minor variations exist between the systems shown in FIGS. 1 and 4; for example, the system of FIG. 4 includes latch 225, timer 223 and select latch 222. However, these variations merely represent expedients which can be readily provided by those skilled in the art to provide suitable interfacing between the various components.

RAM data buffer 227 can be readily implemented utilizing Texas Instruments 74LS244 eight bit three-state buffer integrated circuits. Trim DAC 256 can be readily implemented utilizing a Burr-Brown DAC 862. Random access memory 226 can be utilized by way of a wide variety of static MOS random access memories, for example, the Fairchild 3539 static random access memory integrated circuits. Main DAC 216 can be readily implemented using a Burr-Brown DAC 73. Gain adjustment DAC 261 is a Burr-Brown DAC 862, of which only the eight most significant bits are utilized in the presently implemented embodiment of the invention. The other components utilized in FIG. 4 can be utilized using the same commercially available integrated circuits previously mentioned with reference to corresponding components of FIG. 1.

The operation of self-calibrating DAC 210 of FIG. 4 is similar to that of self-calibrating DAC 10 of FIG. 1 with respect to the gain adjustment procedure utilizing gain adjustment DAC 261. The gain adjustment subroutine for the system of FIG. 4 is illustrated in the flow chart of FIG. 5C, and is similar in many respects to the flow chart of FIG. 2C.

A major advantage of the DAC system 210 of FIG. 4 is that every possible digital input code applied to main DAC 216 can be individually adjusted, thereby allowing non-linear compensation. Non-linear compensation may be especially useful in combating self-heating effects which produce non-linearities in digital to analog converters. Thus, a particular main DAC unit such as main DAC 216 can be thoroughly characterized with respect to variation in its output current with respect to temperature, power supply variation, etc.; the amount of inaccuracies in output current $I_{OUT}$ caused by such variations in temperature, power supply voltage, etc., can be measured and stored in the memory of access memory 226 at addresses corresponding to each combination of digital input signals applied to the DAC. Digital input signals applied to the main DAC inputs are also provided as address inputs to the random access memory to select such stored information for adjusting the output current of the main DAC to compensate for the above mentioned inaccuracies. Variations in temperature and power supply voltage can be converted to corresponding digital signals which also can be utilized as part of the address applied to random access memory 226 to effect fetching information representing the amount of adjustment needed to compensate for inaccuracy in the main DAC output current for a particular combination of digital inputs applied to the main DAC.

Thus, self-calibrating DAC 210 of FIG. 4 is capable of automatically compensating the main DAC output current $I_{OUT}$ for every combination of the 8 most significant bits applied to input buses 242 and 244 without interruption of the digital to analog conversion process. The correction information or correction codes stored in random access memory 226 at locations addressable in response both to the digital inputs applied to main DAC 16 and to additional digital inputs provided in response to temperature variations, power supply variations, etc. are directly applied to the digital inputs of trim DAC 256, which automatically converts such correction codes into the required analog adjustment current for the particular digital number being applied to the inputs of main DAC 216.

Microprocessor system 263 is utilized whenever it is desired to calibrate the system of FIG. 4 by modifying the adjustment data stored in RAM 226. The microprocessor system 263 is also utilized to calibrate the gain adjustment of main DAC 216 is essentially the same manner as previously described with reference to self-calibrating DAC system 10 of FIG. 1 and the gain adjustment algorithm of FIG. 2C.

In certain applications, it is acceptable to permanently store the above mentioned correction codes stored in a memory. A system such as the one utilized in FIG. 6 could be utilized, wherein the microprocessor controlled calibration system is omitted, and the correction codes are stored in a ready only memory 326.

Referring now to FIG. 6, main DAC 316, which is a sixteen bit DAC, has its eight most significant digital inputs 342 (i.e., A0-A7) also connected to a plurality of the address inputs of read only memory 226 (the remaining digital inputs 342A (i.e., A8-A15) are not connected to memory 316). A temperature sensing device 341 produces an electrical signal which is applied to the analog input of analog to digital converter 340. Some of the digital outputs of analog to digital converter 340 are applied to additional address inputs (i.e. Ai-Aj) of read only memory 326. Similarly, an analog to digital converter responsive to variations in power supply voltage on supply voltage conductor could be connected to produce digital output which is connected to additional address conductors of read only memory 326. Read only memory 326 contains output current adjustment information for every combination of digital inputs 342 for all suitable values of temperature to which the main DAC 316 will be exposed and produces a digital output word which is provided as a digital input to trim DAC 356, which modifies the current sensed by operational amplifier circuit 317.

The operation of the self-calibrating DAC of FIG. 4 during the normal digital to analog conversion process is essentially the same as the operation of the system shown in FIG. 6. Of course, a temperature sensor such as 341 of FIG. 6 and an additional ADC such as 340 of FIG. 6 could be provided in the system of FIG. 4 and coupled to additional address inputs of random access memory 226A of FIG. 4 if random access memory 226A has a sufficiently large number of storage locations.

The operation of the system of FIG. 6 is as follows. A digital input word A0, A1 ... A15 (A0 being the most significant bit) is applied to main DAC 316 via digital input buses 342 and 342A. The eight most significant bits of the digital input word (i.e., bits A0-A7) are also connected to address inputs of memory 326 (which may be either a read/write memory or a read only memory). Each location of memory 326 addressable by bits A0-A7 of a digital input word contains a correction code which includes information determining how much adjustment to the output current $I_{OUT}$ of main DAC 316 is necessary to compensate for inaccuracies of main DAC 216 for that digital input word. Each time a digital input word is applied to input bus 342, 342A of main DAC 316, the corresponding correction code stored in memory 326 is fetched and applied to the inputs of trim DAC 356 by means of memory data bus 351. Trim DAC 356 carries out a digital to analog conversion process and creates a correction current $I_{CORR}$ which flows out of output terminal 320, thereby compensating for any error in $I_{OUT}$ for the particular digital word being applied to input bus 342, 342A. The output voltage $V_{OUT}$ at output node 318 is therefore corrected for inaccuracy in the analog to digital conversion process by main DAC 316. As temperature varies, analog to digital converter 340 addresses additional memory locations of memory 326, which additional memory locations contain correction codes which have been adjusted to provide temperature compensation to the correction current $I_{CORR}$.

Next, the automatic calibration procedure carried out by the circuit of FIG. 4 to load the proper correction codes into the respective locations of random access memory 226A is described with reference to FIGS. 5A-5C. The initial step in the self-calibration process for DAC 210 of FIG. 4 is to make an adjustment to compensate for the offset of main DAC 216. The operating algorithm of microprocessor system 263 executes an offset adjustment subroutine, which is entered at label 90' of FIG. 5A. The offset adjustment algorithm involves the same sequence of steps as blocks 90-101 of the offset adjustment algorithm of FIG. 2A, as indicated by block 101' of FIG. 5A. The operation of microprocessor system 263 is executing this portion of the algorithm was set forth in detail hereinbefore, and will not be repeated. However, after the algorithm completes execution of decision block 101 of FIG. 2A, the algorithm enters block 103' of FIG. 5A and computes a correction factor based on the difference between the two digital words obtained by the two analog to digital conversion processes carried out by ADC 279. If the gain of trim DAC 256 and the values of the resistors of resistor network 52 are appropriately selected, the correction factor can be equal to the difference between the two digital words produced by ADC 279.

Next, the algorithm enter blocks 103" and adds the above correction factor to all correction codes stored in the memory. The precise details of this operation can be readily supplied to those skilled in the art, and merely include fetching each correction code presently in random access memory 226A, adding the above correction factor to that correction code, and rewriting the modified correction code into its previous location in random access memory 226. At this point, the executed offset adjustment subroutine is exited at label 104'.

Next, the microprocessor system 263 enters into the linearity adjustment subroutine indicated by label 104 in FIG. 5B, wherein the algorithm carries out a suitable differential linearity adjustment process to obtain new correction factors and add them to the appropriate correction codes already stored in random access memory 226A.

First, the algorithm enters block 107', whereby, it sets a logic variable "n" equal to 8 (assuming that main DAC 216 is a sixteen bit DAC and that it is sufficiently accurate that no compensation corresponding to the least significant eight bits is required). Next, the algorithm enters block 108' and applies logical "1's" to the n−1 bit of both main DAC 261 and offset DAC 274. Thus, for the first pass, the logical "1's" are applied to the nth bits of main DAC 216 and offset DAC 274.

Next, the algorithm enters block 109', and sets analog switch 282 such that conductor 284, which is connected to the positive input of differential amplifier 276, is connected to $V_{OUT}$, i.e., to conductor 218. The algorithm then causes ADC 279 to convert the amplified signal appearing on the output of differential amplifier 276 to a first word, as indicated by blocks 110', 111' and 112' in FIG. 5B.

Next, the algorithm applies logical "1's" to the n least significant bits of main DAC 216, as indicated in block 113'. The algorithm then causes ADC 279 to perform a conversion, producing a result from which is subtracted the above mentioned first word, as indicated in blocks 114'–116'. Next, the algorithm computes a correction factor based on the results of the subtraction process of block 116'. Next, the algorithm fetches all of the present correction codes from all locations for which the nth bit is equal to a logical "1", adds the correction factor of block 117 to the fetched correction codes, and rewrites them in their previous locations, as indicated by block 118. Again, this process can be carried out in a variety of ways by those skilled in the art and the details are therefore not shown.

Next, the algorithm decrements "n", determines whether "n" is less than 1, and returns to block 108' if "n" is not less than 1, as indicated by blocks 119' and 120'. Finally, the algorithm exits at label 121'.

Finally, microprocessor system 263 executes gain adjustment algorithm beginning at label 122' of FIG. 5C. The initial part of the gain adjustment algorithm is the same as the algorithm of FIG. 2C, as indicated by block 133' in FIG. 5C. Once it has been determined that there exists a gain error when logical "1's" are applied to all inputs of main DAC 216, as indicated by decision block 133 of FIG. 2C, the algorithm enters block 135' of FIG. 5C, and computes a correction factor based on the difference between the value of precision reference 286 source and the value of the $V_{OUT}$. Next, the algorithm adds that correction factor to all of the correction codes presently stored in memory 226A as indicated by block 135" in FIG. 5C. The algorithm then exits at label 136'. Microprocessor system 263 can then isolate the digital inputs of main DAC 216 from microprocessor bus 265 and enable the outputs of latches 261 and 329; normal digital to analog conversion of digital words applied to buses 242, 244 then can proceed in the manner described above.

Although the invention has been described with reference to a particular embodiment thereof, various other arrangements of elements and operating steps can be made within the true spirit and scope of the invention.

We claim:

1. A method for automatically calibrating a first digital to analog converter, said first digital to analog converter including a plurality of digital inputs and an output terminal for producing an analog output signal, said method comprising the steps of:
   (a) applying a first pattern of logic signals to the inputs of said first digital to analog converter and also applying at least a portion of said first pattern of logic signals to the address inputs of a memory for storing a plurality of correction codes;
   (b) performing a digital to analog conversion of said first pattern of logic signals to produce a first output voltage;
   (c) temporarily maintaining a first analog signal representative of said first output voltage;
   (d) applying a second pattern of logic signals to the inputs of said first digital to analog converter and also applying a portion of said second pattern of logic signals to the address inputs of said memory;
   (e) performing a digital to analog conversion of said second pattern of logic signals to produce a second output voltage;
   (f) comparing said first analog signal to said second output voltage to produce a first difference signal;
   (g) performing an analog to digital conversion of said first difference signal to produce a first digital word;
   (h) computing a first correction code based on said first digital word;
   (i) writing said first correction code into a first location of said memory determined by said first pattern of logic signals;
   (j) applying said first pattern of logic signals to the inputs of the first digital to analog converter and also applying said portion of said first pattern of logic signals to the address inputs of said memory;
   (k) performing a digital to analog conversion of said first pattern of logic signals to produce said first output current;
   (l) fetching said first correction code from said first location of said memory, said first location being addressed by said portion of said first pattern of logic signals;
   (m) performing a digital to analog conversion of said first correction code to produce a first correction current; and
   (n) adding or subtracting a predetermined proportion of said first correction current to or from said first output current to compensate for an error in said first output current, thereby producing a first corrected output current.

2. A system for automatically calibrating a first digital to analog converter, said first digital to analog converter including a plurality of digital inputs and an output terminal for producing an analog output signal, said system comprising in combination:
  (a) a memory having a plurality of correction codes stored in a plurality of locations respectively addressable by means of the address inputs;
  (b) digital input means for applying a first pattern of logic signals to the inputs of said first digital to analog converter and for applying at least a first portion of said first pattern of logic signals to the address inputs of said memory, whereby said first digital to analog converter produces a first output voltage;
  (c) first conversion means for effecting performing a digital to analog conversion of said first pattern of logic signals by said first digital to analog converter to produce a first output current;
  (d) first control means for effecting fetching a first correction code from a first location of said memory, the first location being addressed by said portion of said first pattern of logic signals;
  (e) second conversion means for performing a digital to analog conversion of said first correction code to produce a first correction current;
  (f) means for adding or subtracting a predetermined proportion of said first correction current to or from said first output current to correct an error in said first output current, thereby producing a first corrected output current;
  (g) calibration means for entering said plurality of correction codes into said memory, said calibration means including
    (i) first means for applying said first pattern of logic signals to the inputs of said first digital to analog converter and also to the address inputs of said memory, whereby said first digital to analog converter produces a first output voltage;
    (ii) first signal means for producing and maintaining a first analog signal representative of said first output voltage;
    (iii) second means for applying a second pattern of logic signals to the inputs of said first digital to analog converter and also to the address inputs of said memory, whereby said digital to analog converter produces a second output voltage;
    (iv) second comparison means for comparing said first analog signal to said second output voltage to produce a first difference signal;
    (v) third conversion means for performing an analog to digital conversion of said first difference signal to produce a first digital word;
    (vi) computing means for computing said first correction code based on said first digital word; and
    (ix) second control means for effecting writing said first correction code into the location of said memory determined by said first pattern of logic signals.

3. A method for automatically calibrating a first digital to analog converter, said first digital to analog converter including a plurality of digital inputs and an output terminal for producing an analog output signal, said method comprising the steps of:
  (a) applying a first pattern of logic signals to the inputs of said first digital to analog converter and also applying at least a portion of said first pattern logic signals to the address inputs of a memory for storing a plurality of correction codes;
  (b) performing a digital to analog conversion of said first pattern of logic signals to produce a first output voltage;
  (c) performing a digital to analog conversion of a predetermined group of said first pattern of logic signals to produce a first offset signal;
  (d) comparing said first offset signal to said first output voltage to produce a first difference signal;
  (e) performing an analog to digital conversion of said first difference signal to produce a first digital word;
  (f) applying a second pattern of logic signals to the inputs of said first digital to analog converter and also applying a portion of said second pattern of logic signals to the address inputs of said memory;
  (g) performing a digital to analog conversion of said second pattern of logic signals to produce a second output voltage;
  (h) comparing said first offset signal to said second output voltage to produce a second difference signal;
  (i) performing an analog to digital conversion of said second difference signal to produce a second digital word;
  (j) computing a first correction code based on the difference between said first and second digital words;
  (k) writing said first correction code into a first location of said memory determined by said first pattern of logic signals;
  (l) applying said first pattern of logic signals to the inputs of the first digital to analog converter and also applying said portion of said first pattern of logic signals to the address inputs of said memory;
  (m) performing a digital to analog conversion of said first pattern of logic signals to produce said first output current;
  (n) fetching said first correction code from said first location of said memory, said first location being addressed by said portion of said first pattern of logic signals;
  (o) performing a digital to analog conversion of said first correction code to produce a first correction current; and
  (p) adding or subtracting a predetermined proportion of said first correction current to or from said first output current to compensate for an error in said first output current, thereby producing a first corrected output current.

4. The method of claim 3 wherein steps (m) and (n) are performed approximately concurrently.

5. The method of claim 3 further including producing a first output voltage in response to said first corrected output current.

6. The method of claim 3 including repeating steps (a) through (k) for a plurality of additional patterns of logic signals to produce a plurality of corresponding additional correction codes and store them in a plurality of additional locations, respectively, of said memory.

7. The method of claim 3 including performing an analog to digital conversion of an environmental variable affecting the accuracy of the first digital to analog converter and including a digital word resulting from that analog to digital conversion in said first pattern of logic signals, whereby said correction current automatically compensates for errors in said first output current due to changes in said environmental variable.

8. The method of claim 5 wherein said memory is a read/write memory.

9. The method of claim 7 wherein said environmental variable is temperature.

10. A system for automatically calibrating a first digital to analog converter, said first digital to analog converter including a plurality of digital inputs and an output terminal for producing an analog output signal, said system comprising in combination:
   (a) a memory having a plurality of correction codes stored in a plurality of locations respectively addressable by means of the address inputs;
   (b) digital input means for applying a first pattern of logic signals to the inputs of said first digital to analog converter and for applying at least a first portion of said first pattern of logic signals to the address inputs of said memory, whereby said first digital to analog converter produces a first output voltage;
   (c) first conversion means for effecting performing a digital to analog conversion of said first pattern of logic signals by said first digital to analog converter to produce a first output current;
   (d) first control means for effecting fetching a first correction code from a first location of said memory, the first location being addressed by said portion of said first pattern of logic signals;
   (e) second conversion means for performing a digital to analog conversion of said first correction code to produce a first correction current;
   (f) means for adding or subtracting a predetermined proportion of said first correction current to or from said first output current to correct an error in said first output current, thereby producing a first corrected output current;
   (g) calibration means for entering said plurality of correction codes in said memory, said calibration means including
      (i) first means for applying said first pattern of logic signals to the inputs of said first digital to analog converter and also to the address inputs of said memory, whereby said first digital to analog converter produces a first output voltage;
      (ii) third conversion means for performing a digital to analog conversion of a predetermined group of said logic signals of said first pattern to produce a first offset signal;
      (iii) first comparison means for comparing said first offset signal to said first output voltage to produce a first difference signal;
      (iv) fourth conversion means for performing an analog to digital conversion of said first difference signal to produce a first digital word;
      (v) second means for applying a second pattern of logic signals to the inputs of said first digital to analog converter and also to the address inputs of said memory, whereby said first digital to analog converter produces a second output voltage;
      (vi) second comparison means for comparing said first offset signal to said second output voltage to produce a second difference signal;
      (vii) fifth conversion means for performing an analog to digital conversion of said second difference signal to produce a second digital word;
      (viii) computing means for computing said first correction code based on the difference between said first and second digital words; and
      (ix) second control means for effecting writing said first correction code into the location of said memory determined by said first pattern of logic signals.

11. The system of claim 10 wherein said fourth and fifth means are included in an analog to digital converter.

12. The system of claim 10 further including third conversion means for performing an analog to digital conversion of an environmental variable which affects the accuracy of said first digital to analog converter to produce at least one of the logic signals of said first pattern, whereby said correction current is varied to automatically compensate for inaccuracy in said output current caused by changes in said environmental variable.

13. The system of claim 10 further including amplifier means for producing a first output voltage in response to said first corrected output current.

14. The system of claim 10 including a processor system which includes said first means, said second means, said computing means, and said first and second control means.

15. The system of claim 10 wherein said memory is a read/write memory.

16. The system of claim 10 wherein said first and second comparison means are included in a differential amplifier.

* * * * *